United States Patent [19]
Dillman

[11] Patent Number: 4,881,045
[45] Date of Patent: Nov. 14, 1989

[54] TRANSISTOR AMPLIFIER FOR HIGH SLEW RATES AND CAPACITIVE LOADS

[75] Inventor: Norman G. Dillman, El Paso, Tex.

[73] Assignee: Hewlett-Packard Company, Palo Alto, Calif.

[21] Appl. No.: 260,854

[22] Filed: Oct. 18, 1988

[51] Int. Cl.[4] ............................................. H03F 3/45
[52] U.S. Cl. ...................................... 330/253; 330/257
[58] Field of Search ............... 330/255, 257, 253, 260; 307/263, 359

[56] References Cited

U.S. PATENT DOCUMENTS

| | | | |
|---|---|---|---|
| 4,240,040 | 12/1980 | Saarl | 330/255 |
| 4,636,743 | 1/1987 | Cotrean | 330/257 X |
| 4,739,281 | 4/1988 | Doyle | 330/255 X |

*Primary Examiner*—James B. Mullins
*Attorney, Agent, or Firm*—William W. Cochran

[57] ABSTRACT

A Class-A complementary metal oxide semi-conductor (CMOS) operational amplifier is provided having an improved slew rate. The preferred embodiment of the invention utilizes a CMOS amplifier circuit and an external capacitor, which together exhibit relatively poor sourcing of current and hence a relatively low positive slew rate in response to an input signal being more positive than an output signal of the CMOS amplifier by a relatively large amount. The disparity between the input and output signals defines an error signal. The present invention also includes a supplemental output stage communicating with the amplifier circuitry and the external capacitor. The supplemental output stage is activated in order to supply additional sourcing current, thereby increasing the positive slew rate, when a relatively large error signal is present and is de-activated otherwise. The present invention can also provide an improved negative slew rate in a CMOS amplifier circuit and an external capacitor, which together exhibit poor sinking of current in response to the input signal being more negative than the output signal by a relatively large amount.

12 Claims, 1 Drawing Sheet

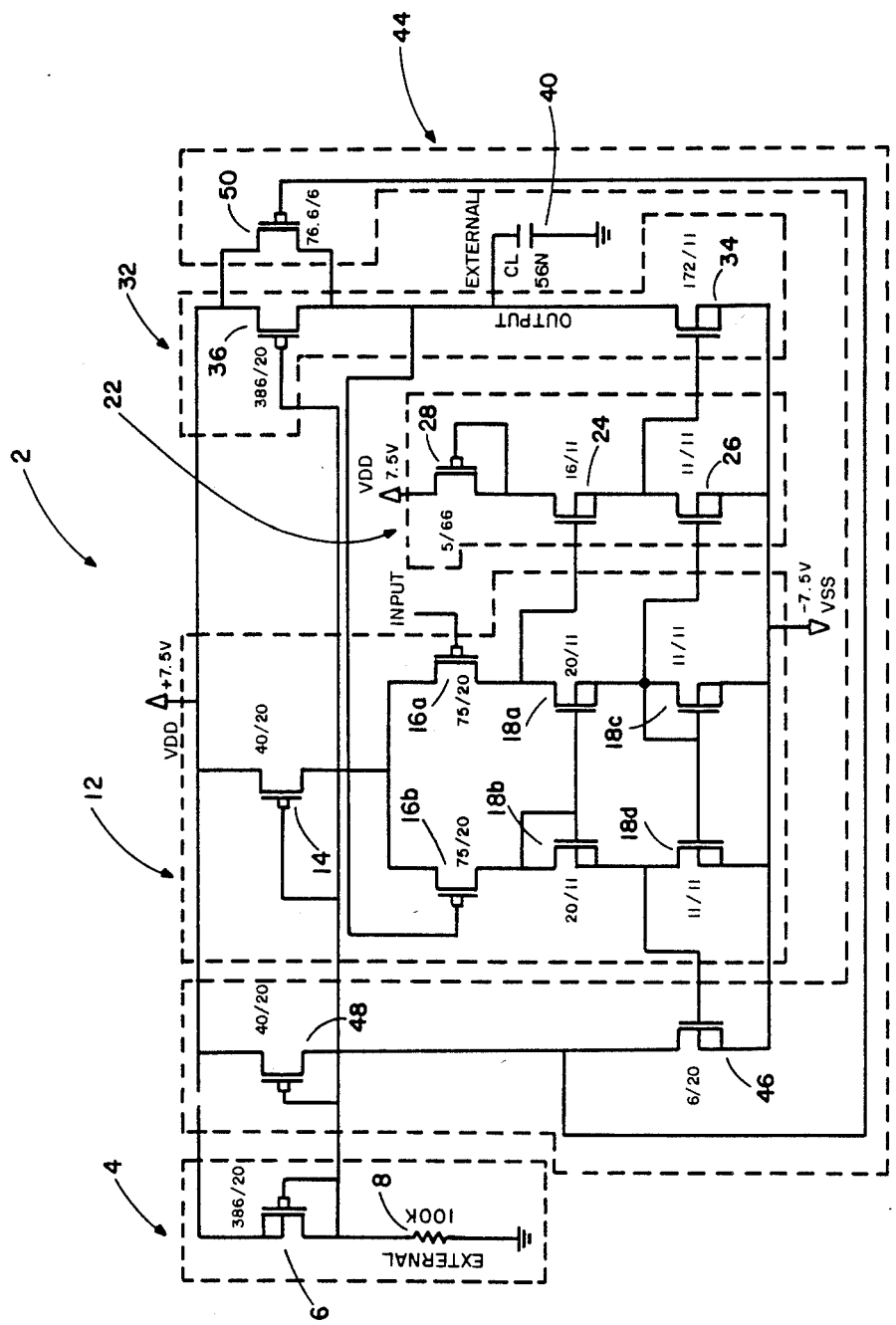

TRANSISTOR AMPLIFIER FOR HIGH SLEW RATES AND CAPACITIVE LOADS

FIELD OF THE INVENTION

The present invention relates to a transistor amplifier that provides a relatively high slew rate and particularly to a CMOS amplifier useful for driving a high capacitive load.

BACKGROUND OF THE INVENTION

Current Class-A CMOS operational amplifiers include output stages that source or sink dc current to a load based upon the difference between the output and input signals. For example, if the output signal is more negative than the input signal then, the output stage of the amplifier sources or supplies more current to the load. Conversely, if the output signal is more positive than the input signal, then the output stage of the amplifier sinks current or pulls current away from the load. Typically, Class-A CMOS operational amplifiers are able to either source or sink current very well but cannot provide both good sourcing and sinking of current. This is especially evident where there is a large disparity between the input and output signals. Consequently, the current Class-A CMOS amplifiers exhibit a relatively high slew rate in one direction (sourcing/sinking) and a relatively low slew rate in the opposite direction (sinking/sourcing). Slew rate is defined as the time rate of change of the closed-loop amplifier output voltage under large-signal conditions, i.e. where there is a large disparity between the input and output signals.

Current CMOS operational amplifier design also requires a dominant S-plane pole to stabilize the amplifier and thereby prevent oscillation. Typically, the dominant S-plane pole is realized by an internal capacitor of 10 to 20 picofarads. On-chip capacitors are limited in size and their presence adds complexity, and hence expense, to the CMOS operational amplifier. Further, the size limitation of on-chip capacitors limit the CMOS operational amplifier's ability to filter noise. There is also an inverse relationship between the size of the capacitor and the CMOS operational amplifier's ability to respond under large signal conditions. Hence the capacitor affects the slew rate. For example, the higher the capacitance used to determine the dominant S-plane pole, the lower the ability of the CMOS operational amplifier to respond to a large disparity between the input and output signals.

A possible solution to the inability of current CMOS operational amplifiers to provide a high slew rate in both directions is to employ a Class-B amplifier rather than a Class-A amplifier. However, Class-B amplifiers are extremely hard to bias and maintain in a linear operation. Another possible solution is to employ a bi-polar output circuit connected to the CMOS operational amplifier. However, a bi-polar circuit would consume more power, take up more space, and dissipate more heat, thereby requiring more cooling and reducing the reliability of the circuit. Further, bipolar circuits are typically not available with the high input impedance CMOS devices.

Consequently, there exists a need for a Class-A CMOS operational amplifier having a high slew rate in both directions as characterized by its ability to both source and sink current well when there is a large difference between the input and output signals associated with the amplifier and/or a high capacitive load.

SUMMARY OF THE INVENTION

The preferred embodiment of the present invention provides an improved positive slew rate, preferably in Class-A complementary metal-oxide semi-conductor (CMOS) operational amplifiers. The present invention is comprised of a controllable, supplementary output stage that provides source current in addition to that supplied by the output stage of the conventional Class-A CMOS operational amplifier. The additional source current provided by the supplementary output stage improves or increases the positive slew rate of the amplifier when an error signal, indicative of a large difference between the input signal and the more negative output signal, is present. Further, the supplementary output stage is activated or switched on when the error signal exceeds a threshold magnitude and switched off otherwise.

The preferred embodiment of the invention, an integrated chip, includes a bias circuit for establishing the operating or quiescent currents of the CMOS field-effect transistors (FET) employed in the amplifier. The preferred embodiment also includes a differential gain stage for providing an error signal that is used by a supplementary output stage to toggle a current source which provides supplemental source current to an external load if there is a large disparity between the input signal and the more negative output signal. The differential gain stage also provides a difference signal that operates to maintain unity gain between the input and output signals. Unity gain means that the amplifier operates to maintain the amplitude of the input signal equal to the amplitude of the output signal. Unity gain amplifiers, known in the art as buffers, are used to isolate the circuitry on the output side of the amplifier from the circuitry on the input side of the amplifier while maintaining the amplitude of the signal passed therebetween. Consequently, the circuitry on the input side of the amplifier is unaffected by the circuitry on the output side of the amplifier.

The preferred embodiment of the present invention further includes an intermediate stage that insulates the differential gain stage from an output stage while transmitting the difference signal therebetween. Further, the intermediate stage level shifts the difference signal before applying it to the output stage. Level shifting of the difference signal assures that the output stage is properly biased and improves the frequency response of the amplifier by isolating a high capacitive load from the differential gain stage.

Further included in the preferred embodiment of the present invention is an output stage that, in responding to the level shifted difference signal supplied by the intermediate stage, provides either source current to charge an external capacitor or sinks current to discharge the external capacitor. Sourcing by the output stage increases the voltage across the external capacitor while sinking decreases the voltage across the capacitor. The CMOS transistor amplifier described thus far is comprised of conventional elements that sink current extremely well but, due to the limited current provided by the load device (a P-channel or PMOS device) in the output stage, does not source current very well. Therefore, the amplifier described thus far exhibits a low positive slew rate.

The low slew rate problem is further exacerbated by employing, in the preferred embodiment, a 56 nanofarad external capacitor. The external capacitor provides, among other things, a dominant S-plane pole which prevents oscillations and thereby stabilizes the amplifier. Further, the external capacitor, over 10,000 times larger than the 10-20 picofarad on-chip capacitors employed in current CMOS transistor amplifiers, provides improved noise reduction (filtering).

In order to remedy the low positive slew rate problem, the present invention employs a supplemental output stage that supplies additional source current when the amplifier is presented with a large error signal indicative of a large difference between the input signal and the more negative output signal. The supplemental output stage operates to compare the error signal to a threshold. If the error signal is greater than the threshold then an auxiliary source, a PMOS output transistor, is activated to augment the sourcing current being supplied by the Class-A output stage. Conversely, if the error signal is less than or equal to the threshold then the auxiliary PMOS output transistor is deactivated. Essentially, the supplemental output stage is a Class-B amplifier that is active when large error signals are present and inactive otherwise. Consequently, the supplemental output stage operates to improve the positive slew rate.

A contemplated use of the preferred embodiment of the invention is in providing a reference voltage generator for a circuit board tester. As such the preferred embodiment of the invention must be able to produce, by its ability to source and sink current, an output signal or voltage spanning a range of approximately eleven volts. Further, the preferred embodiment of the invention must provide, as required by the circuit board tester application, a settling time of less than 500 microseconds. Settling time is the time necessary for the output signal or voltage to reach a point within 10 mv of the final voltage, in this application the input voltage, under maximum load and over the entire input signal range. Consequently, the preferred embodiment of the present invention provides, as required by the range and settling time requirements of the circuit board tester, a reference voltage generator that slews very fast in both directions. In addition, 48 Class-A CMOS operational amplifiers having the improved slew rate are integrated onto a single chip for use in the circuit board tester.

Among the advantages realized by the present invention is an improved positive slew rate that makes operational amplifiers, including CMOS operational amplifiers, more responsive to large error signals. Further, since the present invention is only activated to provide additional sourcing current when a large error signal, indicative of an input signal that is more positive than the output signal by a relatively large amount, is present and deactivated otherwise it saves power. The preferred embodiment of the invention also, advantageously, provides an improved buffer or operational amplifier having unity gain. Similarly, the relatively large external load capacitor utilized in the preferred embodiment of the invention provides stability and improved filtering. Another advantage is that the circuitry utilized in practicing the present invention can be manufactured using well-known CMOS technology that produces circuit elements that are easy to bias and relatively insensitive to manufacturing process variations. Consequently, the circuitry required to practice the present invention is relatively inexpensive. Lastly, the present invention does not degrade the current sinking capability of the CMOS transistor amplifier utilized in the preferred embodiment of the invention.

BRIEF DESCRIPTION OF THE DRAWING

The single Figure is a schematic view of a CMOS transistor amplifier of the present invention including the supplemental output stage for improving the slew rate.

DETAILED DESCRIPTION OF THE PRESENT INVENTION

The preferred embodiment of the transistor amplifier 2, hereinafter amplifier 2, is illustrated in the Figure. The amplifier 2 is, preferably, a CMOS transistor amplifier comprised of a plurality of field-effect transistors (FET) integrated onto a single chip. Consequently, unless otherwise indicated, the elements described hereinafter as comprising the amplifier 2 are integrated onto a single chip. The FET's utilized in the amplifier 2 can be either P-channel (PMOS) or N-channel (NMOS) FET's. The P-channel FET's are symbolized in the Figure by a small cap or box on the gate, a non-standard symbol. The N-channel FET's, in contrast have no such box or hat at the gate. Further included in the Figure are the width and length measurements (in microns) of the conducting channels of the various FET's comprising the amplifier 2. The dimensions of the conducting channel, as is known in the art, define various parameters associated with the FET. Notably, the dimensions of the conducting channel determine the magnitude of the drain current in the FET.

The amplifier 2 includes a bias circuit 4 for establishing the operating or quiescent currents for the FET's comprising the amplifier 2. The bias circuit 4 includes a bias FET 6 and an external resistor 8, preferably of 100k ohms. The source of the bias FET 6 is connected to the supply voltage VDD, preferably 7.5 volts. The external resistor 8 is connected between the drain of the bias FET 6 and ground. The supply voltage VDD establishes a voltage drop across the external resistor 8 of approximately 6 volts. A connection between the gate and drain of the bias FET 6 establishes a gate voltage that, in turn, produces a drain current of approximately 60 micro-amperes to satisfy the voltage drop across the external resistor 8. The gate voltage of the bias FET 6 is applied to the gates of several other FET's in the amplifier 2, thereby establishing their operating or quiescent currents. These FET's, in turn, bias or establish the operating points of other FET's in the amplifier 2. The supply voltage VDD in conjunction with another supply voltage VSS, preferably −7.5 volts, define an operating or input/output signal range of approximately 11 volts, ±5.5 volts, for the amplifier 2.

Also included in the amplifier 2 is a differential gain stage 12 which performs at least two functions. First, the differential gain stage 12 compares the input signal to the output signal and generates a difference signal indicative of any difference therebetween. The difference signal is subsequently applied to an output stage which operates to eliminate any difference between the input and output signals. Consequently, the differential gain stage 12 operates to keep the output signal equal to the input signal thereby achieving a closed-loop gain of one or unity gain. Second, the differential gain stage 12 provides an error signal, also indicative of the difference between the input and output signals, that is used to activate a supplementary Class-B output stage when additional source current is required. The differential gain stage 12 is comprised of a first current source FET 14, differential FET's 16a, 16b, current mirror FET's 18a, 18b, 18c and 18d. The combination of the current mirror FET's 18a, 18b, 18c and 18d is known in the art as a Wilson current mirror. The first current source FET 14 can be modeled as an ideal current source supplying a current of approximately 6 microamperes to the node connecting its drain to the sources of the differential FET's 16a, 16b. The gates of the differential FET's 16a, 16b are connected, respectively, to the input signal and the output signal. The differential FET's 16a, 16b operate to divide the current produced by the first current source FET 14 among their respective drains according to the difference between the input and output signal. For example, if the input and output signals are equal then the differential FET's 16a, 16b divide the current supplied by the first current source FET 14 equally between their respective drains. If, on the other hand, the input signal is more negative than the output signal then the differential FET's 16a, 16b operate to force a greater amount of the current supplied by the first current source FET 14 to the drain of the differential FET 16a. Similarly, if the input signal is more positive than the output signal then the differential FET's 16a, 16b orate to force a greater amount of the current produced by the first current source FET 14 to the drain of the differential FET 16b.

The current mirror FET's 18a, 18b, 18c and 18d cooperate to produce a difference signal, the voltage existing at the drain of the differential FET 16a, in accordance with the drain currents flowing through the differential FET's 16a, 16b. For example, if the input signal is more negative than the output signal then the differential FET's 16a, 16b operate to produce a smaller drain current in the differential FET 16b than in the differential FET 16a. The smaller drain current in differential FET 16b in turn produces a lower gate voltage in the current mirror FET's 18a, 18b. This, in turn, produces a difference signal, the voltage at the drain of differential FET 16a, that is indicative of the input signal being more negative than the output signal. Cascading of the current mirror FET's 18a, 18b and the current mirror FET's 18c, 18d provides additional gain to the difference signal produced. The current mirror FET's 18a, 18b, 18c, 18d also cooperate to provide an error signal, also indicative of the difference between the input and output signals, that is used to activate a supplementary Class-B output stage when additional source current is required. The error signal is the voltage existing at the drain of the current mirror FET 18d.

The amplifier 2 is also comprised of an intermediate stage 22 that primarily provides isolation of the differential gain stage 12 from an output stage. The isolation provided by the intermediate stage 22 also increases the frequency response of the amplifier 2. The intermediate stage 22 also acts as a level shifter to match the quiescent operating point of the output of the differential gain stage 12. The intermediate stage 22 is comprised of an isolater FET 24, an isolator load FET 26, and a protection FET 28. The isolator FET 24 and the isolator load FET 26 combine to create a source follower that insulates the differential gain stage 12 from an output stage in the amplifier 2 and yet applies the difference signal produced by the differential gain stage 12 to an output stage at an appropriate dc level. More specifically, the difference signal produced by the differential gain stage 12 is applied to the gate of the isolator FET 24 which, in turn, produces a control voltage signal at the drain of the isolator load FET 26. The control voltage signal is, essentially, the difference signal shifted due to the operation of the isolator load FET 26. The protection FET 28, with its source connected to the supply voltage VDD and its gate and drain connected to the drain of the isolator FET 24, functions to reduce the maximum voltage across the isolator FET 24 thereby preventing or avoiding possible high field problems.

Amplifier 2 is also comprised of an output stage 32 having a drive FET 34 and a load FET 36 for supplying the DC load current. The drive FET 34 can be conceptualized as a variable resistor that is responsive to the control signal produced by the intermediate stage 22 and applied to its gate. The load FET 36, on the other hand, can be modeled as a constant current source that defines the magnitude of the drain current in the drive FET 34. Consequently, the drive FET 34 and the load FET 36 cooperate to produce an output voltage across an external capacitor 40 (at the drain of the drive FET 34) that is responsive to the control signal applied to the gate of the drive FET 34. For example, if the control signal causes the drive FET 34 to appear to be a large resistor then the load FET 36 will supply source current to, or charge, the capacitor 40 thereby increasing the voltage across capacitor 40. Conversely, if the control signal causes the drive FET 34 to appear to be a small resistor, then the drive FET 34 sinks current, or discharges, the external capacitor 40 thereby decreasing the voltage across the external capacitor 40. However, due to the presence of the external capacitor 40, the output voltage is not instantaneously responsive to the control signal. The elements of the amplifier 2 described thus far sink current very well but do not source current very well, especially if there is a large disparity between the input signal and a more negative output signal. Consequently, the amplifier 2 described thus far does not possess a high positive slew rate.

A supplementary Class-B output stage 44 is included in the amplifier 2 to provide the additional source current needed for a high positive slew rate. The supplementary Class-B output stage 44 is comprised of a switch FET 46, a second current source FET 48 and a slew FET 50. The switch FET 46 and the second current source FET 48 cooperate to turn "on" the slew FET 50 once a threshold indicative of a large error signal is exceeded. The error signal, as previously discussed, is representative of the difference between the input and output signals. Consequently, the slew FET 50 is in either an "on" or "off" state. The second current source FET 48 supplies a constant current to the drain of the switch FET 46 thereby defining a threshold. The voltage at the drain of the second current mirror FET 18d of the error signal, is applied to the gate of the switch FET 46. If the error signal applied to the gate of the switch FET 46 does not exceed the threshold defined by the second current source FET 48 then the slew FET 50 is turned "off". If, on the other hand, the signal applied to the gate of the switch FET 46 exceeds the threshold defined by the second current source FET 48 then a voltage is applied to the gate of the slew FET 50 turning it "on" and thereby providing the additional source current needed to realize a high positive slew rate. More specifically, the slew FET 50 is "off" when the second current source FET 48 has biased switch FET 46 into an "off" state and the voltage being applied to the gate of switch FET 46 is insufficient to turn it "on". In this situation, there is insufficient voltage at the gate of slew FET 50 to turn it "on". Similarly, the slew FET 50 is "on", and supplying additional source current to the load, when the voltage being applied to the gate of switch FET 46 overcomes the bias current supplied by the second current source FET 48 thereby turning the switch FET 46 "on". Once the switch FET 46 is turned "on", a low voltage results at the gate of the slew FET 50 turning it "on".

Having described the elements comprising the amplifier 2 and their interrelationship, an example of the amplifier's operation when presented with an input signal requiring application of the supplementary Class-B output stage 44 to realize a improved positive slew rate is presented. In the preferred embodiment an error signal sufficient to activate the slew FET 50 in the supplementary Class-B output stage 44 is characterized by the input signal being more positive than the output signal by several ten's of millivolts. Under such circumstances, the differential gain stage 12 outputs a difference signal, the voltage at the drain of the first current mirror FET 18a, which is level shifted by the intermediate stage 22 and applied to the output stage 32 as a control voltage signal. The load FET 36 responds to the control voltage signal by supplying source current to the external capacitor 40 thereby increasing the voltage at the output. The load FET 36 alone, however, exhibits a relatively low slew rate. The relatively low slew rate of the load FET 36 manifests itself in a relatively long delay between the presentation of the input signal to the amplifier 2 and the presentation of a similar signal at the output of the amplifier 2. Essentially, the load FET 36 supplies current to the external capacitor 40 (thereby increasing the output voltage across capacitor 40) at a rate such that there is a relatively long delay between the presentation of the input signal and the presentation of equivalent output signal. In response to this situation, the differential gain stage 12 operates to produce an increased error signal, the voltage at the drain of the second current mirror FET 18d, that overcomes the bias current supplied by the second current source FET 48 to the switch FET 46. Consequently, the switch FET 46 is turned "on" thereby turning the slew FET 50 "on" as previously described. The activated slew FET 50, in turn, operates t o supplement the current produced by the load FET 36 thereby improving the positive slew rate. In other words, the activated slew FET 50 and the load FET 36 cooperate to source current to, or charge, the external capacitor 40 at a much greater rate than the load FET 36 alone. As a result of the increase in the rate at which the capacitor 40 is charged, the rate at which the output voltage, the voltage across the capacitor 40, also increases. Consequently, the switch FET 46, the second current source FET 48 and the slew FET 50 of the supplementary Class-B output stage 44 cooperate to increase the positive slew rate of the amplifier 2.

Several modifications can be made to the preferred embodiment of the invention without departing from the scope of the present invention. Namely, a dual circuit of the disclosed amplifier 2 could be realized by making all of the P-channel (PMOS) FET's illustrated in the Figure into N-channel (NMOS) FET's and vice versa thereby realizing an amplifier with an improved negative slew rate. The dual circuit would also require the supply voltages in FIG. 1 to be exchanged. Consequently, the PMOS FET's and the NMOS FET's in the dual circuit would be connected to the positive supply voltage VDD and the negative supply voltage VDD, respectively. The supplementary Class-B output stage in this instance would provide additional sinking capability. Further, an internal or integrated resistor could replace the external resistor 8 if required. The resistance of the external resistor 8 can also be varied to produce a wide range of operating or quiescent currents. Additionally, the present invention can accommodate closed-loop gains greater than or less than unity. The supply voltages, VDD and VSS, which establish, among other things, the operating range and the bias currents in the amplifier are specific to a particular application of the invention. Consequently, the supply voltages can be altered to accommodate other applications of the invention. The present invention is also capable sourcing and sinking current to a resistive load provided there is sufficient capacitance to stabilize the amplifier.

Based on the foregoing, the present invention provides a relatively high slew rate when a relatively large error signal indicative of the input signal being much more positive than the output signal is present. This is achieved by providing a supplemental output stage characterized by its ability to supply additional current to a capacitive load. Preferably, the capacitive load communicates with an integrated circuit and has a substantially greater capacitance, than that found in the prior art, to provide improved filtering and circuit stability.

The foregoing description of the invention has been presented for purposes of illustration and description. Further, the description is not intended to limit the invention to the form disclosed therein. Consequently, variations and modifications commensurate with the above teachings, and the skill or knowledge in the relevant art are within the scope of the present invention. The preferred embodiment described hereinabove is further intended to explain the best mode known of practicing the invention and to enable others skilled in the art to utilize the invention in various embodiments and with the various modifications required by their particular applications or uses of the invention. It is intended that the appended claims be construed to include alternative embodiments to the extent permitted by the prior art.

What is claimed is:

1. An apparatus for providing an improved slew rate in an amplifier, comprising:
    first means for providing an error signal using an input signal and an output signal;
    second means for providing a threshold and outputting a control signal depending upon the value of said threshold and said error signal;
    output means for providing a output signal; and
    third means communicating with said control signal and said output means for increasing a slew rate associated with said output signal depending upon said control signal.
2. An apparatus, as claimed in claim 1, wherein: said slew rate is a positive slew rate.
3. An apparatus, as claimed in claim 1, wherein: said slew rate is a negative slew rate.
4. An apparatus, as claimed in claim 1, wherein: said first means includes a differential gain stage for receiving an input signal and providing a difference signal.
5. An apparatus, as claimed in claim 4, wherein:

said first means further includes an intermediate stage communicating with said differential gain stage for level shifting a signal applied to said output means.

6. An apparatus, as claimed in claim 1, wherein:
said third means includes means for providing a signal relating to current for effecting the value of said output signal.

7. An apparatus, as claimed in claim 1, wherein:
said second means includes means for activating which provides said control signal when a signal relating to said input signal exceeds said threshold value.

8. An apparatus, as claimed in claim 1, wherein:
said output means includes capacitor means.

9. An apparatus, as claimed in claim 8, wherein:
said capacitor means has a capacitance of at least 1 nf.

10. An apparatus for providing an improved slew rate in an amplifier, comprising:
   a differential gain stage for receiving an input signal and providing an error signal and a difference signal;
   an intermediate stage communicating with said differential gain stage for level shifting a signal relating to said difference signal;
   an output stage communicating with said intermediate stage for receiving a signal relating to said difference signal and outputting an output signal; and
   a supplemental output stage communicating with said output stage and said error signal, said supplemental output stage generating a threshold value and increasing a slew rate associated with said output signal when a signal relating to said input signal is different from said threshold value.

11. An apparatus, as claimed in claim 10, further including:
   a bias stage for establishing appropriate parameters associated with the apparatus.

12. An apparatus, as claimed in claim 10, wherein:
said output stage includes a capacitor and wherein said differential gain stage and said intermediate stage are part of an integrated circuit and wherein said capacitor is external to said integrated circuit.

* * * * *